(12) United States Patent
Yamauchi

(10) Patent No.: US 7,377,793 B2
(45) Date of Patent: May 27, 2008

(54) ELECTRONIC APPARATUS

(75) Inventor: Satoshi Yamauchi, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/649,379

(22) Filed: Jan. 4, 2007

(65) Prior Publication Data
US 2007/0161287 A1 Jul. 12, 2007

(30) Foreign Application Priority Data
Jan. 10, 2006 (JP) .............................. 2006-002875

(51) Int. Cl.
H01R 12/00 (2006.01)
(52) U.S. Cl. .................. 439/76.1; 439/573; 361/704; 361/690; 361/719
(58) Field of Classification Search ............... 439/76.1, 439/573, 79; 361/704, 690, 719, 707
See application file for complete search history.

(56) References Cited

U.S. PATENT DOCUMENTS

| 6,816,377 | B2 | 11/2004 | Itabashi et al. |
| 6,866,524 | B2 | 3/2005 | Takata |
| 7,031,165 | B2 | 4/2006 | Itabashi et al. |
| 7,189,010 | B1* | 3/2007 | Tomikawa et al. ............. 385/88 |
| 2001/0027038 | A1* | 10/2001 | Nishikawa et al. ......... 439/76.1 |
| 2004/0082206 | A1* | 4/2004 | Chang et al. ............... 439/76.1 |
| 2005/0170676 | A1* | 8/2005 | Yuan et al. ................. 439/76.1 |
| 2006/0141821 | A1* | 6/2006 | Berglund et al. ........... 439/76.1 |
| 2007/0049068 | A1* | 3/2007 | Yanagida .................... 439/76.1 |

FOREIGN PATENT DOCUMENTS

JP      A-2002-261470      9/2002

* cited by examiner

Primary Examiner—Gary F. Paumen
(74) Attorney, Agent, or Firm—Posz Law Group, PLC

(57) ABSTRACT

An electronic apparatus includes a circuit board having a printed board and an electronic component mounted to the printed board, a housing for receiving the circuit board therein, and a connector mounted to the printed board. Top and bottom walls of the housing have board-fixing means for fixing the circuit board to the housing. The connector has a connector-fixing portion that extends along the printed board and is placed on a first surface portion of the printed board. The connector-fixing portion is fixed to the first surface portion by connector-fixing means such as a screw. The connector-fixing portion and a second surface portion, opposite to the first surface portion, of the printed board are sandwiched between the board-fixing means so that the circuit board is fixed to the housing.

13 Claims, 5 Drawing Sheets

ELECTRONIC APPARATUS

CROSS REFERENCE TO RELATED APPLICATION

This application is based on and incorporates herein by reference Japanese Patent Application No. 2006-2875 filed on Jan. 10, 2006.

FIELD OF THE INVENTION

The present invention relates to an electronic apparatus including a circuit board having a printed board and an electronic component mounted to the printed board, a housing for receiving the circuit board therein, and a connector mounted to the printed board.

BACKGROUND OF THE INVENTION

An electronic apparatus disclosed in U.S. Pat. No. 7,031,165B2 corresponding to JP-2003-289191A includes a housing having upper and lower portions, a circuit board received in the housing, and an electronic component mounted to the circuit board. The circuit board is sandwiched between the upper and lower portions of the housing and fixed to the housing by a mounting screw to prevent displacement (i.e., movement) of the circuit board from its mounting position in the housing. Therefore, the circuit board has first regions where the circuit board is fixed to the housing and the electronic component can be mounted to regions except the first regions. In short, the electronic component is prohibited from being mounted to the first regions, which are hereinafter called "the first prohibited regions".

In a connector mounting structure disclosed in U.S. Pat. No. 6,866,524B2 corresponding to JP-2004-206924A, a connector is fixed to a circuit board by a mounting screw inserted into a hole of a flange portion provided on each side wall of the connector. Therefore, the circuit board has second regions where the circuit board is fixed to the flange portion of the connector and the electronic component can be mounted to regions except the second regions. In short, the electronic component is prohibited from being mounted to the second regions, which are hereinafter called "the second prohibited regions".

In an electronic apparatus having the structures disclosed in U.S. Pat. Nos. 7,031,165B2 and 6,866,524B2, a circuit board needs both the first prohibited regions for fixing the circuit board to the housing and the second prohibited regions for fixing the connector to the circuit board. Therefore, a total area of the first and second prohibited regions occupies a larger proportion of a surface area of the circuit board. As a result, the size of the circuit board is increased unless the number of electronic components mounted to the circuit board is reduced.

The second prohibited regions may be eliminated by providing the flange portion to a bottom wall of the connector. However, this approach increases the height of the connector from the surface of the circuit board by the thickness of the flange portion. As a result, the height of the electronic apparatus is increased.

SUMMARY OF THE INVENTION

In view of the above-described problem, it is an object of the present invention to provide an electronic apparatus having a structure for achieving a high-density printed board to reduce the size of the electronic apparatus.

An electronic apparatus includes a circuit board having a printed board and an electronic component mounted to the printed board, a housing for receiving the circuit board therein, and a connector having a body and connector pins disposed in the body.

At least one of top and bottom walls of the housing has board-fixing means for fixing the circuit board to the housing. The body of the connector has a connector-fixing portion that extends along the printed board and is placed on a first surface portion of the printed board. Each of the connector pins has a first end connected to the printed board and a second end exposed to an outside of the housing to be connectable to an external device.

The connector-fixing portion is fixed to the first surface portion of the printed board by connector-fixing means such as a screw. The board-fixing means fixes the circuit board to the housing by touching at least one of the connector-fixing portion of the connector and a second surface portion of the printed board. The second surface portion is opposite to the first surface portion so that a high-density printed board can be achieved. Thus, the size of the printed board can be reduced to reduce the size of the electronic apparatus.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
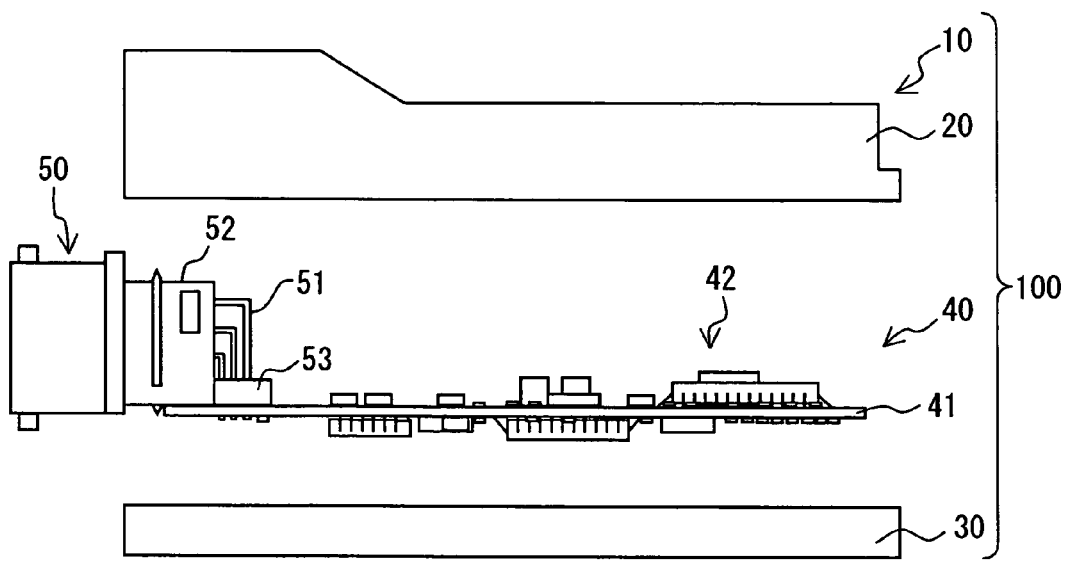
FIG. 1 is an exploded view of an electronic apparatus according to a first embodiment of the present invention.

Referring to FIG. 1, an electronic apparatus 100 includes a housing 10 having space therein, a circuit board 40 received in the housing 10, and a connector 50 mounted to the circuit board 40. For example, the electronic apparatus 100 is not waterproofed and is used as an engine electronic control unit (ECU).

The housing 10 is made of synthetic resin or metal such as aluminum or iron. The housing 10 includes a hollow case 20 with an opening and a shallow plate-like cover 30 for covering the opening. The cover 30 covers the opening of the case 20 so that the housing 10 has the space therein. The case 20 and the cover 30 are fixed together, for example, by a screw.

As described above, the housing 10 is constructed from two pieces, i.e., the case 20 and the cover 30. Alternatively, the housing 10 may be constructed from a single piece or more than three pieces.

The circuit board 40 includes a printed board 41 and an electronic component 42 mounted to the printed board 41. The printed board 41 has wiring patterns and via-holes connecting the wiring patterns. The printed board 41 is made of commonly known material such as thermoplastic resin, thermoset resin, ceramic, composite material of glass material (e.g., glass fabric) and resin. For example, the electronic component 42 is a microcomputer, a power transistor, a resistor, a capacitor, or the like.

The connector 50 is mounted to the printed board 41. The circuit board is electrically connected to an external circuit (not shown) through the connector 50. The connector 50 includes connector pins 51 made of conductive material and a body 52 made of insulating material. The connector pins 51 are molded into the body 52 and have first ends electrically connected to the printed board 41 and second ends exposed to the outside of the housing 10. The body 52 has a connector-fixing portion 53 fixed to a first surface portion of the printed board 41. For example, the connector-fixing portion 53 is a flange member that extends from the body 52 along the printed board 41. The connector-fixing portion 53 is placed on the first surface portion of the printed board 41 and fixed to the printed board 41 by a connector-fixing means such as a screw. Thus, the connector 50 is fixed to the printed board 41.

The housing 10 has a cutout portion (not shown) having a shape corresponding to the connector 50. The connector 50 is sandwiched between the case 20 and the cover 30 at the cutout portion and the case 20 and the cover 30 are fixed together by a screw. As a result, the connector 50 has a first portion located inside the housing 10 and a second portion located outside the housing 10. The first portion of the connector 50 includes the first ends of the connector pins 51 and the second portion of the connector 50 includes the second ends of the connector pins 51.

The printed board 41 is fixed to the housing 10 to prevent displacement (i.e., movement) of the printed board 41 from its mounting position in the housing 10. For example, the printed board 41 is sandwiched between the case 20 and the cover 30, and then the case 20, the cover 30, and the printed board 41 are fixed together by the screw. Therefore, the printed board 41 has first regions 43 where the printed board 41 is fixed to the housing 10 and the electronic component 42 can be mounted to regions except the first regions 43. In short, the electronic component 42 is prohibited from being mounted to the first regions 43, which are hereinafter called "the first prohibited regions 43".

As described above, the connector-fixing portion 53 of the connector 50 is fixed to the printed board 41. Therefore, the printed board 41 has second regions 44 where the printed board 41 is fixed to the connector-fixing portion 53 and the electronic component 42 can be mounted to regions except the second regions 44. In short, the electronic component 42 is prohibited from being mounted to the second regions 44, which are hereinafter called "the second prohibited regions 44".

Figure 2A:
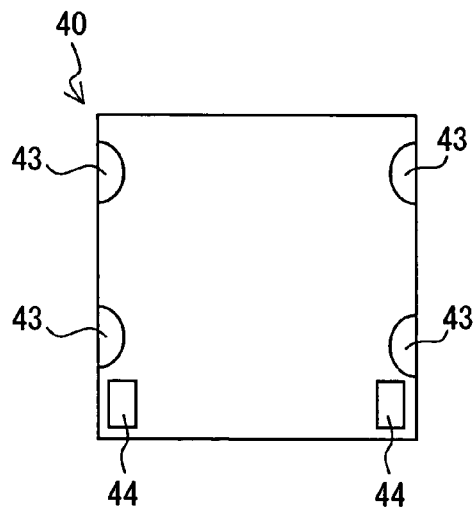
FIG. 2A is a plan view showing a mounting prohibited region in a printed board of a conventional electronic apparatus.

For example, as shown in FIG. 2A, a conventional electronic apparatus needs four first prohibited regions 43 and two second prohibited regions 44. In the conventional electronic apparatus, the second regions 44 can be reduced by providing the connector-fixing portion 53 to a bottom wall, facing the printed board 41, of the body 52. However, this approach increases the height of the connector 50 from the printed board 41 by the thickness of the connector-fixing portion 53. As a result, the height of the electronic apparatus 100 is increased.

Figure 2B:
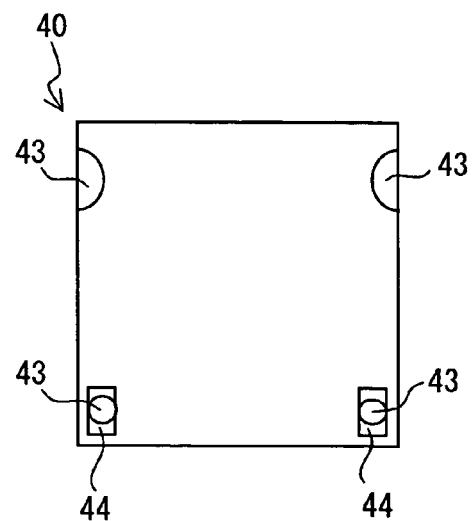
FIG. 2B is a plan view showing the mounting prohibited region in a printed board of the electronic apparatus of FIG. 1.

As shown in FIG. 2B, in the electronic apparatus 100, the first prohibited regions 43 overlap the second prohibited regions 44. Thus, in the electronic apparatus 100, a total area of the first and second regions 44 occupy a reduced proportion of the surface area of the printed board 41 as compared to in the conventional electronic apparatus. Therefore, the electronic apparatus 100 can be reduced in height, length, and width.

Figure 3:
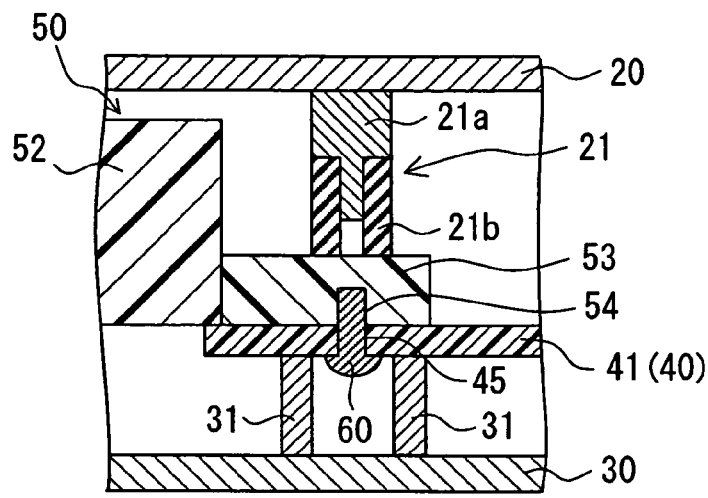
FIG. 3 is a cross-sectional view of the electronic apparatus of FIG. 1.

Specifically, as shown in FIG. 3, the connector-fixing portion 53 extends from the body 52 along the printed board 41 to touch the first surface portion of the printed board 41. The printed board 41 and the connector-fixing portion 53 are fixed together by a screw 60 acting as the connector fixing means. The screw 60 can securely fix the connector-fixing portion 53 to the printed board 41 as compared to a well-known snap-fitting means. Thus, the printed board 41 is reinforced by the connector-fixing portion 53 to reduce distortion (i.e., to prevent deformation) of the printed board 41, caused by difference in linear coefficient of expansion between the printed board 41 and the body 52. Connection reliability of the connector pins 51 can be increased by providing the connector-fixing portion 53 near a connection region between the connector pins 51 and the printed board 41.

In the first embodiment, the body 52 is provided with two connector-fixing portions 53. The two connector-fixing portions 53 are unitary with the body 52 and extend from different portions of the body 52. Therefore, the connector 50 is fixed to the printed board 41 at two points, i.e., the printed board has two second prohibited regions 44. Each of the fixing portions 53 has a groove 54 and the printed board 41 has a hole 45. The connector 50 is fixed to the printed board 41 by passing the screw 60 through the hole 45 and inserting the screw 60 into the groove 54. Thus, the hole 45, the groove 54, and the screw 60 act as the connector fixing means.

The connector-fixing portion 53 has thickness that provides the connector-fixing portion 53 with stiffness larger than stiffness that the printed board 41 has at a portion where the connector-fixing portion 53 and the printed board 41 are fixed together. In such an approach, the printed board 41 is effectively reinforced by the connector-fixing portion 53.

The case 20 has a case-fixing portion 21 extending toward the connector-fixing portion 53 to touch a top surface of the connector-fixing portion 53. The case-fixing portion 21 includes a pole portion 21a having a top portion and a hollow cylindrical portion 21b. The pole portion 21a is unitary with the case 20. The hollow cylindrical portion 21b is made of rubber and inserted into the top portion of the pole portion 21a. The hollow cylindrical portion 21b touches the connector-fixing portion 53 to press down the circuit board 40. Due to elasticity of the hollow cylindrical portion 21b, the circuit board 40 is fixed to the housing 10. Also, the elasticity reduces stress applied to the printed board 41 when the connector 50 is inserted into a female connector (not shown). Also, the elasticity reduces stress applied to the printed board 41 by weights (e.g., body 52, the female connector, and a harness connected to the female connector) applied to the connector-fixing portion 53. Also, the elasticity reduces heat and cold stress applied to the printed board 41.

The cylindrical portion 21b is designed such that the case-fixing portion 21 can fix the circuit board 40 to the housing 10 even under minimum load and the cylindrical portion 21b is not destroyed even under maximum load. For example, the cylindrical portion 21b has a compression ratio of between 5 and 40 percent, preferably approximately 20 percent. When the cylindrical portion 21b has the compression ratio of 20 percent, the cylindrical portion 21b is capable of being compressed up to approximately 80 percent of its normal size. The cylindrical portion 21b has rubber hardness of between 30 and 80 degree, preferably between 45 and 65 degree. In this embodiment, the cylindrical portion 21b has length of 9 millimeter, the compression ratio of 20 percent, and the hardness of 55 degree.

Figure 4:
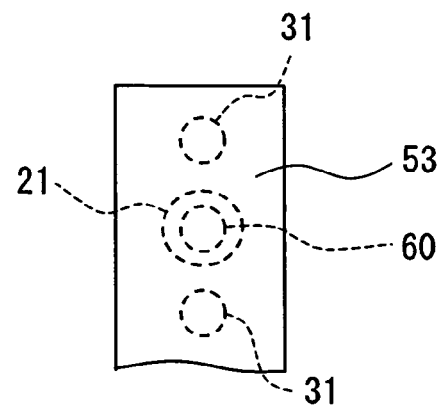
FIG. 4 is a plan view showing positional relationships between a connector-fixing portion, a case-fixing portion, a cover-fixing portion, and a connector-fixing means of the electronic apparatus of FIG. 1.

The cover 30 has a cover-fixing portion 31 that extends toward the printed board 41 to touch a second surface portion of the printed board 41. The second surface portion is opposite to the first surface portion, where the connector-fixing portion 53 is fixed. Therefore, as shown in FIGS. 3 and 4, the cover-fixing portion 31 is positioned under the connector-fixing portion 53 across the printed board 41. In this embodiment, two cover-fixing portions 31 are provided to each connector-fixing portion 53 and are unitary with the cover 30.

The connector-fixing portion 53 and the printed board 41 are fixed together by the screw 60 and sandwiched between the case-fixing portion 21 and the cover-fixing portion 31. Thus, the circuit board 40 is fixed in the housing 10 by the case-fixing portion 21 and the cover-fixing portion 31. Therefore, the case-fixing portion 21 and the cover-fixing portion 31 act as a board-fixing means for fixing the circuit board 40 to the housing 10.

As shown in FIGS. 3 and 4, the case-fixing portion 21 is placed in the center of gravity of the two cover-fixing portions 31. Specifically, the case-fixing portion 21 coincides with the center of gravity of the two cover-fixing portions 31 in a direction perpendicular to the printed board 41. In such an approach, the circuit board 40 is stably sandwiched between the case 20 and the cover 30 so that the distortion of the printed board 41 is efficiently reduced. Likewise, the screw 60 is placed in the center of gravity of the two cover-fixing portions 31. Therefore, the screw 60 coincides with the case-fixing portion 21 in the direction perpendicular to the printed board 41. Thus, the distortion of the printed board 41 is efficiently reduced.

The housing 10 and the body 52 of the connector 50 are separated from each other even when a maximum displacement within tolerance occurs due to application of external stress such as vibration, heat, and cold stress. Therefore, contact stress caused to the body 52 by the housing 10 can be prevented so that a reduction in the connection reliability of the connector pins 51 can be prevented. A clearance between the housing 10 and the body 52 is reduced as much as possible. In such an approach, the housing 10 receives a portion of the stress caused when the connector 50 is inserted into the female connector so that the reduction in the connection reliability of the connector pins 51 can be prevented. Further, the case-fixing portion 21 touches the top surface of the connector-fixing portion 53 to fix the circuit board 40 to the housing 10 even when the maximum displacement within the tolerance occurs.

As described above, in the electronic apparatus 100, the case-fixing portion 21 touches the top surface of the connector-fixing portion 53 fixed to the first surface portion of the printed board 41. The cover-fixing portion 31 touches the second surface of the printed board 41. Since the second surface is opposite to the first surface, the case-fixing portion 21, the cover-fixing portion 31, and the connector-fixing portion 53 overlap each other across the printed board 41. Thus, as shown in FIG. 2B, the first regions 43 overlap the second regions 44. Therefore, in the electronic apparatus 100, the total area of the first and second prohibited regions 43, 44 occupy the reduced proportion of the surface area of the printed board 41 as compared to in the conventional electronic apparatus. Therefore, in the electronic apparatus 100, the printed board 41 can have high mounting density so that an increased number of the electronic components 42 can be mounted to the printed board. In the first embodiment, as can be seen by comparing FIG. 2A and FIG. 2B, the total area of the first and second prohibited regions 43, 44 is reduced by the area of the two first prohibited regions 43.

According to the electronic apparatus 100, the printed board 41 can have high mounting density. Therefore, the printed board 41 can be reduced in size (i.e., width and length). Further, since the connector-fixing portion 53 extends from the body 52 along the printed board 41, the height of the connector 50 from the printed board 41 can be reduced. Therefore, the electronic apparatus 100 can be reduced in width, length, and height.

According to the electronic apparatus 100, the printed board 41 and the connector-fixing portion 53 are sandwiched together between the case-fixing portion 21 and the cover-fixing portion 31. Thus, the connector-fixing portion 53 reinforces the printed board 41 to improve the stiffness of the printed board 41. Therefore, the stress applied to the printed board 41 when the connector 50 is inserted into the female connector is reduced. Also, the stress applied to the printed board 41 by the weights (e.g., body 52, the female connector, and a harness) applied to the connector-fixing portion 53 is reduced. Also, the heat and cold stress applied to the printed board 41 is reduced. As a result, the distortion (i.e., deformation) of the printed board 41 caused by the stress can be reduced.

Figure 5A:
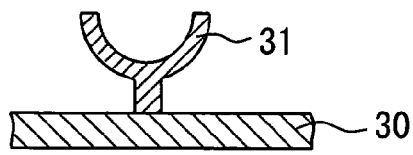
FIG. 5A is a cross-sectional view of a cover-fixing portion according to a modification of the electronic apparatus of FIG. 1.
Figure 5B:
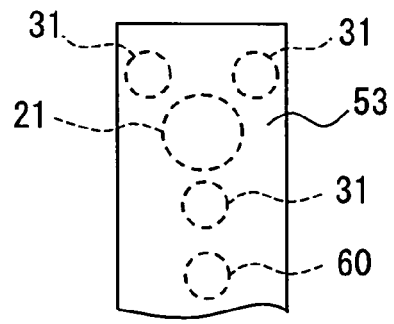
FIG. 5B is a plan view showing positional relationships between the connector-fixing portion, the case-fixing portion, the cover-fixing portion, and the connector-fixing means of the modification.

In the first embodiment, two cover-fixing portions 31 are provided to each connector-fixing portion 53. Alternatively, one or more than two cover-fixing portions 31 may be provided to each connector-fixing portion 53. For example, as shown in FIG. 5A, when one cover-fixing portion 31 is provided to each connector-fixing portion 53, the cover-fixing portion 31 may have a two-forked end that touches the second surface portion of the printed board 41. In this case, the distortion of the printed board 41 can be effectively reduced by placing the case-fixing portion 21 in the center of gravity of the two-forked end of the cover-fixing portion 31. When three cover-fixing portions 31 are provided to each connector-fixing portion 53, the case-fixing portion 21 may be placed in the center of gravity of the three cover-fixing portions 31 as shown in FIG. 5B.

In the first embodiment, the screw 60 acting as the connector-fixing means is placed in the center of gravity of the cover-fixing portions 31. Alternatively, as shown in FIG. 5B, the screw 60 may be placed in a location other than the center of gravity of the cover-fixing portions 31.

In the first embodiment, the board-fixing means includes the case-fixing portion 21 and the cover-fixing portion 31. Specifically, each connector-fixing portion 53 is sandwiched between one case-fixing portion 21 and two cover-fixing portions 31 so that the circuit board 40 is fixed to the housing 10. Alternatively, each connector-fixing portion 53 may be sandwiched between two case-fixing portions 21 and one cover-fixing portion 31.

In the first embodiment, the circuit board 40 is fixed to the housing 10 by the board-fixing means extending from both the case 20 and the cover 30. Alternatively, the circuit board 40 may be fixed to the housing 10 by the board-fixing means extending one of the case 20 and the cover 30. In short, the board-fixing means may fix the circuit board 40 by touching at least one of the connector-fixing portion 53 and the second surface portion of the printed board 41. Thus, the circuit board 40 may be fixed to the housing 10 without being sandwiched between the board-fixing means. For example, the board-fixing means may be a screw or a rivet that is provided to one of the case 20 and the cover 30 and penetrates through the housing 10.

Second Embodiment

Figure 6:
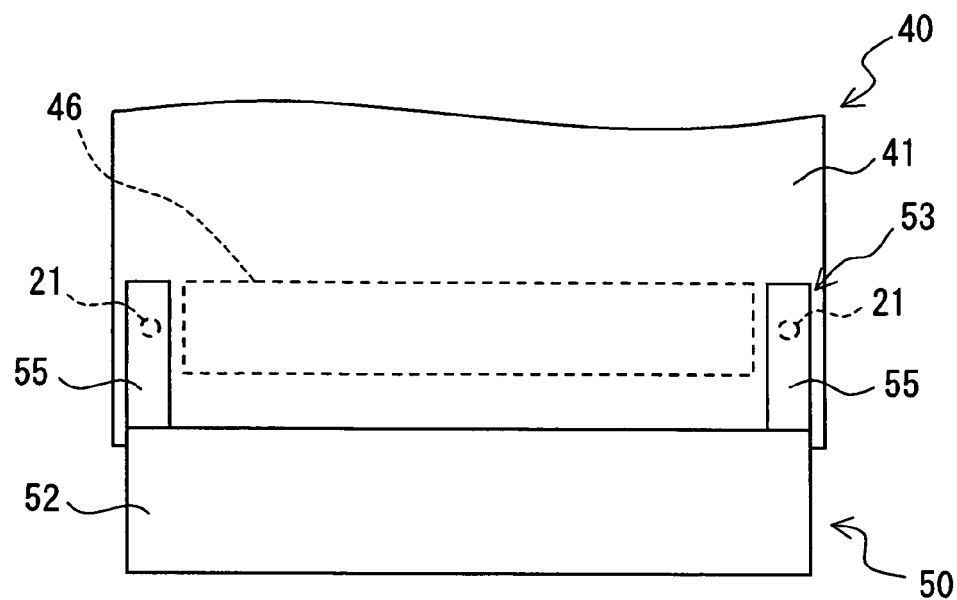
FIG. 6 is a plan view of a printed board of an electronic apparatus according to a second embodiment of the present invention.

As shown in FIG. 6, in an electronic apparatus 100 according to the second embodiment, two first connector-fixing portions 55 extend from the body 52 of the connector 50 toward a connection region 46 where the connector pins 51 are connected to the printed board 41. The connection region 46 is provided between the two first connector-fixing portions 55, i.e., the connection region 46 defines position of the connector 50 relative to the printed board 41.

Although the first connector-fixing portions 55 act as the connector-fixing portions 53 of the first embodiment, the length of the first connector-fixing portions 55 is greater than that of the connector-fixing portions 53. Therefore, the first connector-fixing portions 55 strongly reinforce the printed board 41 and strongly fix the connector 50 to the printed board 41 as compared to the connector-fixing portions 53. Further, the connection region 46 is provided between (i.e., near) the first connector-fixing portions 55, the connection reliability of the connector pins 51 is improved.

Even when the connection region 46 is partially provided between the first connector-fixing portions 55 due to a relatively small length of the first connector-fixing portions 55, the connection reliability of the connector pins 51 can be partially improved. Increasing the length of the fist connector-fixing portions 55 can increase the connection reliability. However, increasing the length of the connector-fixing portions 55 increases the proportion of the second regions 44 in the printed board 41. Therefore, in the second embodiment, the first connector-fixing portions 55 extend to a far-side edge of the connection region 46 from the body 52. In such an approach, while the second regions 44 are reduced as much as possible, the connection reliability of the connector pins 51 can be improved.

In the second embodiment, the first connector-fixing portions 55 are unitary with the body 52. Alternatively, the body 52 and the first connector-fixing portions 55 may be different (i.e., separate) pieces and fixed together, for example, by a screw.

Third Embodiment

Figure 7:
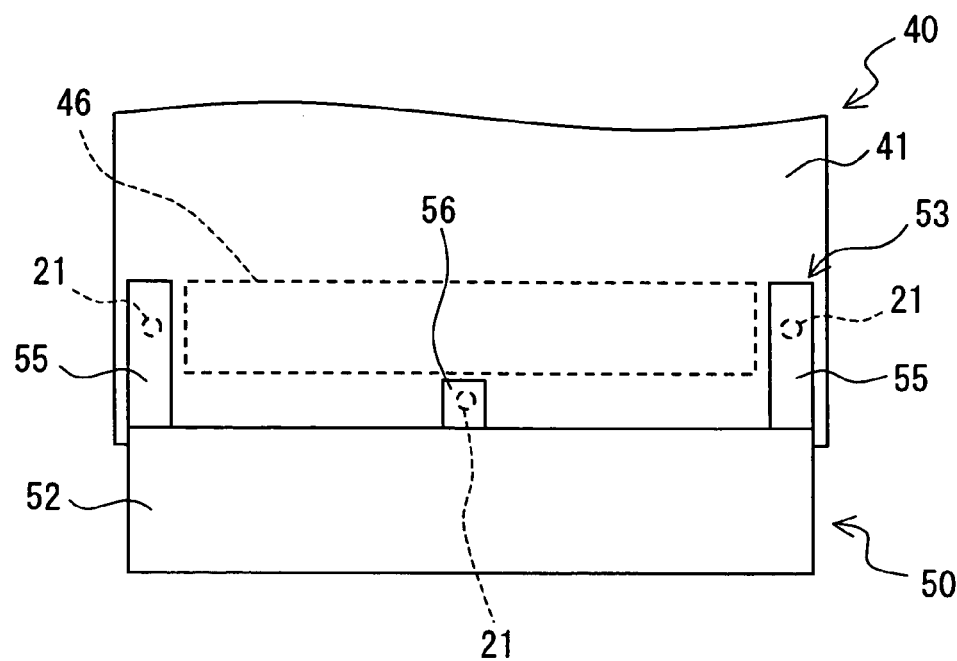
FIG. 7 is a plan view of a printed board of an electronic apparatus according to a third embodiment of the present invention.

As shown in FIG. 7, in an electronic apparatus 100 according to the third embodiment, the body 52 of the connector 50 includes a second connector-fixing portion 56 in addition to the two first connector-fixing portions 55 of the second embodiment. The length of the second connector-fixing portion 56 is different from that of the first connector-fixing portions 55.

Specifically, the second connector-fixing portion 56 is unitary with the body 52 and placed in the middle between the two first connector-fixing portions 55. The length of the second connector-fixing portion 56 from the body 52 is less than that of the first connector-fixing portions 55 and the second connector-fixing portion 56 does not overlap the connection region 46 (i.e., does not touch the connector pins 51). Therefore, connecting three points where the case-fixing portions 21 touch the first and second connector-fixing portions 55, 56 forms a triangular plane not a straight line.

In the third embodiment, the first and second connector-fixing portions 55, 56 are arranged to form the triangular plane so that the connector 50 is firmly fixed to the printed board 41 near the connection region 46. This approach reduces the distortion of the printed board 41 near the connection region 46 so that the connection reliability of the connector pins 51 can be more improved.

In the third embodiment, the length of the second connector-fixing portion 56 from the body 52 is less than that of the first connector-fixing portions 55. Alternatively, the length of the second connector-fixing portion 56 may be greater than that of the first connector-fixing portions 55. In this case, the connection region 46 is divided into two regions.

In the third embodiment, one second connector-fixing portion 56 is provided between the first connector-fixing portions 55. Alternatively, two or more second connector-fixing portions 56 are provided between the first connector-fixing portions 55.

In the third embodiment, the second connector-fixing portion 56 is unitary with the body 52. Alternatively, the body 52 and the second connector-fixing portion 56 may be different (i.e., separate) pieces and fixed together, for example, by a screw.

Fourth Embodiment

Figure 8A:
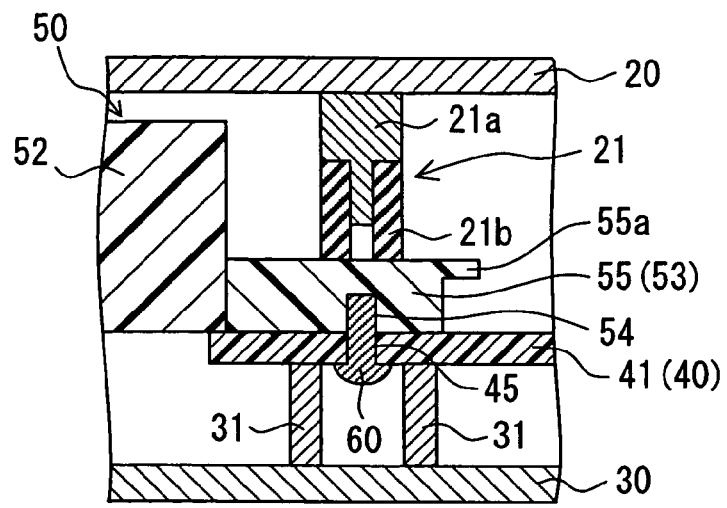
FIG. 8A is a cross-sectional view of an electronic apparatus according to a fourth embodiment of the present invention.
Figure 8B:
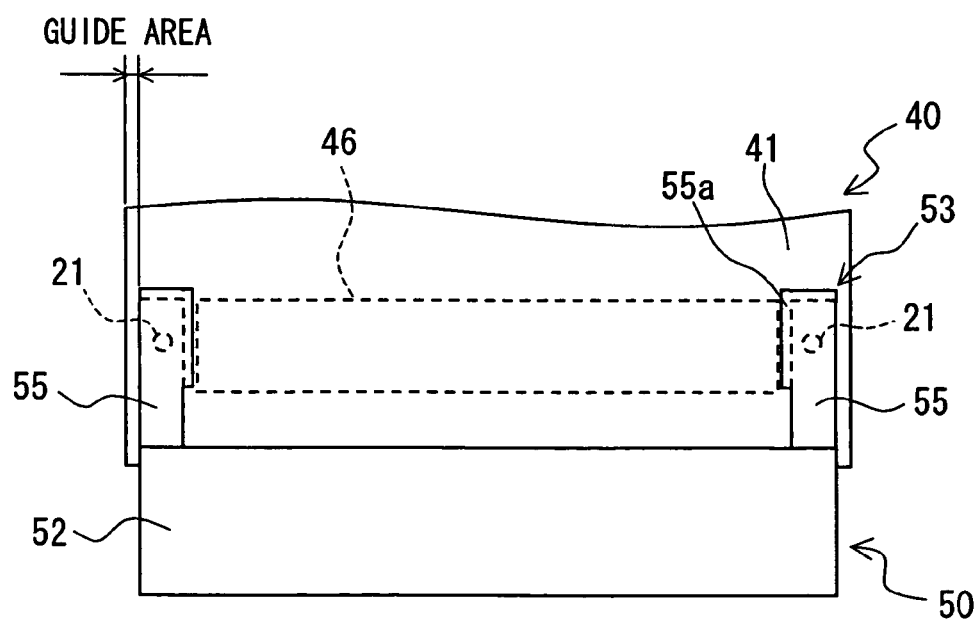
FIG. 8B is a plan view of a printed board of the electronic apparatus according to the fourth embodiment.

As shown in FIG. 8, in an electronic apparatus 100 according to the fourth embodiment, the first connector-fixing portions 55 have an expansion portion 55a extends from an upper portion of the first connector-fixing portion 55. Therefore, the first connector-fixing portions 55 have the top surface larger than a bottom surface fixed to the first surface potion of the printed board 41. When the circuit board 40 is fixed in the housing 10, the case-fixing portion 21 touches the top surface of the first connector-fixing portions 55 and the printed board 41 touches the bottom surface of the first connector-fixing portion 55.

Since the top surface is increased by the area of the expansion portion 55a, the case-fixing portion 21 can stably touch the top surface. Thus, the circuit board 40 is firmly fixed to the housing 10 without increasing the proportion of the second prohibited regions 44 in the printed board 41.

The expansion portion 55a extends toward the connection region 46 side. This approach increases a guide area used to transfer the circuit board 40 in a manufacturing process (e.g., reflow process). If the expansion portion 55a extends toward the opposite side to the connection region 46 side, the guide area is reduced and the circuit board 40 cannot be stably transferred in the manufacturing process. Therefore, it is preferable that the expansion portion 55a extend toward the connection region 46 side.

The expansion portion 55a is unitary with the first connector-fixing portions 55. Alternatively, the first connector-fixing portions 55 and the expansion portion 55a may be different (separate) pieces and fixed together, for example, by a screw.

Fifth Embodiment

Figure 9:
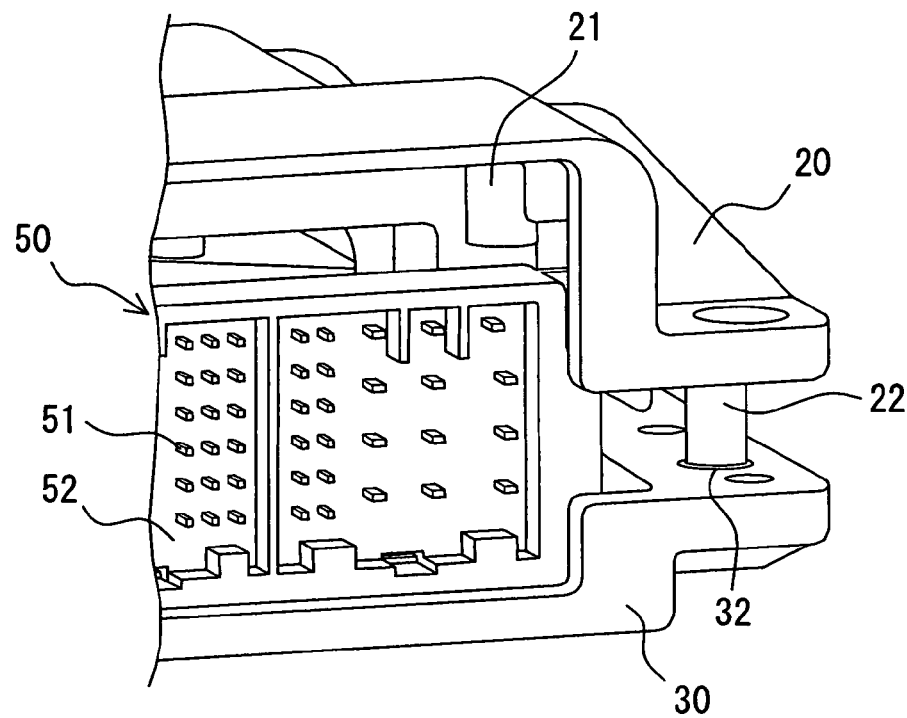
FIG. 9 is a perspective view of an electronic apparatus according to a fifth embodiment of the present invention.

As shown in FIG. 9, in an electronic apparatus 100 according to the fifth embodiment, the case 20 has a projecting portion 22 and the cover 30 has a hole portion 32. The case 20 and the cover 30 can be easily and precisely assembled into the housing 10 by inserting the projecting portion 22 into the hole portion 32.

The projection portion 22 has a length in the thickness direction of the printed board 41. The length of the projecting portion 22 is set greater than the maximum height of the connector pins 51 from the surface of the printed board 41 to prevent the case-fixing portion 21 from touching the connector pins 51 when the projecting portion 22 of the case 20 is fully inserted into the hole portion 32 of the cover 30.

According to the first embodiment, when the case 20 and the cover 30 are assembled into the housing 10, the case-fixing portion 21 does not touch the connector pins 51. Thus, the connector pins 51 are prevented from being damaged by the case-fixing portion 21. Therefore, connection failure between the connector pins 51 and the printed board 41 can be prevented.

In the fifth embodiment, two pairs of the projecting portion 22 and the hole portion 32 are provided such that the connector 50 is interposed between the two pairs. Alternatively, more than two pairs may be provided to assemble the case 20 and the cover 30 into the housing 10 more easily.

Modifications

Figure 10:
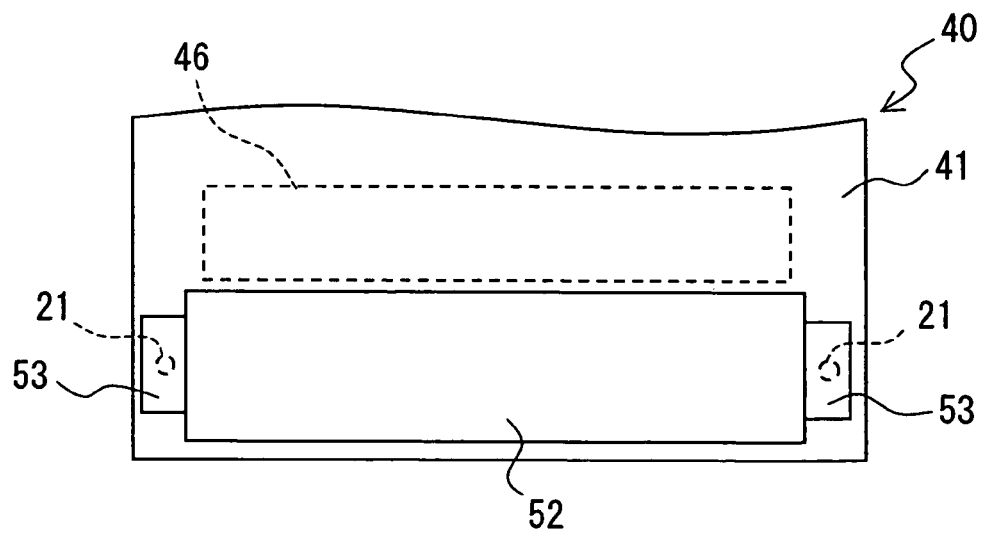
FIG. 10 is a plan view of a printed board of an electronic apparatus according to a modification.

The embodiments described above may be modified in various ways. In the embodiments, the connector-fixing portions 53, 55, 56 extend from a front wall, facing the connection region 46, of the body 52. Alternatively, as shown in FIG. 10, the connector-fixing portions 53, 55, 56 may extend from side walls of the body 52 along the surface of the printed board 41.

Such changes and modifications are to be understood as being within the scope of the present invention as defined by the appended claims.

What is claimed is:

1. An electronic apparatus comprising:
  a circuit board including a printed board and an electronic component mounted to the printed board;
  a housing having top and bottom walls that define space for receiving the circuit board, at least one of the top and bottom walls having board-fixing means for fixing the circuit board to the housing;
  a connector including a body having a connector-fixing portion that extends along the printed board and is placed on a first surface portion of the printed board, the body further having a plurality of connector pins each of which has a first end connected to the printed board and a second end exposed to an outside of the housing to be connectable to an external device; and
  connector-fixing means for fixing the connector-fixing portion to the printed board, wherein
  the board-fixing means touches at least one of the connector-fixing portion and a second surface portion of the printed board, the second surface portion being opposite to the first surface portion.

2. The electronic apparatus according to claim 1, wherein
  the housing includes a hollow case with an opening and a cover for covering the opening of the hollow case,
  the board-fixing means includes a case-fixing portion provided to the hollow case and a cover-fixing portion provided to the cover, and
  the connector-fixing portion of the connector and the second surface portion of the printed board are sandwiched between the case-fixing portion and the cover-fixing portion so that the circuit board is fixed to the housing.

3. The electronic apparatus according to claim 2, wherein
  one of the case-fixing portion and the cover-fixing portion has a first tip and an other of the case-fixing portion and the cover-fixing portion has a plurality of second tips,
  the first tip touches one of the connector-fixing portion of the connector and the second surface portion of the print board,
  each of the second tips touches an other of the connector-fixing portion and the second surface portion, and
  the first tip coincides with a center of gravity of the second tips in a thickness direction of the printed board.

4. The electronic apparatus according to claim 3, wherein
  the connector-fixing means coincides with the center of gravity of the second tips in the thickness direction.

5. The electronic apparatus according to claim 2, wherein
  at least one of the case-fixing portion and the cover-fixing portion has a tip portion made of rubber, the tip potion touching the connector-fixing portion of the connector or the second surface portion of the printed board.

6. The electronic apparatus according to claim 2, wherein
  one of the case and the cover has a projecting portion and an other of the case and the cover has a hole portion for receiving the projecting portion, and
  the projecting portion has a length in a thickness direction of the printed board, the length being larger than a maximum height of the connector pins from a surface of the printed board.

7. The electronic apparatus according to claim 1, wherein
  the printed board has a first stiffness in a portion corresponding to the first surface portion, where the connector-fixing portion of the connector is placed,
  the connector-fixing portion has a thickness for providing a second stiffness with the connector-fixing portion, and
  the second stiffness is equal to or greater than the first stiffness.

8. The electronic apparatus according to claim 1, wherein
  the connector-fixing portion has a third surface portion that touches the first surface portion of the printed board and a fourth surface portion opposite to the third surface portion, and
  the fourth surface portion is larger than the third surface portion.

9. The electronic apparatus according to claim 8, wherein
  the connector-fixing portion has an expansion portion that extends along the fourth surface portion.

10. The electronic apparatus according to claim 9, wherein
  the expansion portion extends toward the connector pins side.

11. The electronic apparatus according to claim 1, wherein
the connector-fixing portion includes a pair of first portions between which a connection region is provided, and
the second end of each of the connector pins is connected to the printed board within the connection region.

12. The electronic apparatus according to claim 11, wherein
each of the first portions has a first length from the body, the connector-fixing portion further includes a second portion placed between the first portions and having a second length from the body, and
the first length is different from the second length.

13. The electronic apparatus according to claim 12, wherein
the second length is less than the first length.

* * * * *